(12) United States Patent
Feng et al.

(10) Patent No.: US 12,256,712 B1
(45) Date of Patent: Mar. 25, 2025

(54) REMOTE CONTROLLER FOR PREVENTING ACCIDENTAL TRIGGERING AND BARK CONTROL COMPONENT

(71) Applicant: Shenzhen SmartPet Technology Co., Ltd., Shenzhen (CN)

(72) Inventors: Wenjin Feng, Shenzhen (CN); Junyong Zhang, Shenzhen (CN)

( * ) Notice: Subject to any disclaimer, the term of this patent is extended or adjusted under 35 U.S.C. 154(b) by 0 days.

(21) Appl. No.: 18/900,833

(22) Filed: Sep. 29, 2024

(30) Foreign Application Priority Data

Sep. 14, 2024 (CN) .......................... 202422265626.7

(51) Int. Cl.
| | |
|---|---|
| *A01K 15/02* | (2006.01) |
| *G08C 17/02* | (2006.01) |
| *H05K 5/02* | (2006.01) |

(52) U.S. Cl.
CPC ............ *A01K 15/022* (2013.01); *G08C 17/02* (2013.01); *H05K 5/0208* (2013.01)

(58) Field of Classification Search
CPC ..... A01K 15/022; G08C 17/02; H05K 5/0208
See application file for complete search history.

(56) References Cited

U.S. PATENT DOCUMENTS 11,039,601 B1 * 6/2021 Jia .......................... G01H 17/00

FOREIGN PATENT DOCUMENTS

CN 118525767 A * 8/2024 ........... A01K 15/022

* cited by examiner

*Primary Examiner* — Yvonne R Abbott-Lewis

(57) ABSTRACT

A remote controller for preventing accidental triggering includes a first outer housing, a first circuit board provided on the first outer housing, stopping blocks arranged on the first outer housing, and a movable member movably arranged on the first outer housing. The first circuit board is equipped with a switch. The movable member is configured to switch between a locked position and a released position when moving relative to the first outer housing. The movable member is blocked by the stopping block when in the locked position. When in the released position, the movable member is disengaged from the limiting of the stopping block, and can move in a direction close to the switch under external force to trigger the switch. When the remote controller is not needed, the movable member can be adjusted to the locked position, preventing the switch from being triggered accidentally during the carrying process.

20 Claims, 11 Drawing Sheets

REMOTE CONTROLLER FOR PREVENTING ACCIDENTAL TRIGGERING AND BARK CONTROL COMPONENT

CROSS-REFERENCE TO RELATED APPLICATIONS

The application claims priority of Chinese patent application CN2024222656267, filed on 2024 Sep. 14, which is incorporated herein by reference in its entireties.

TECHNICAL FIELD

The present invention relates to the technical field of bark control components, particularly to a remote controller for preventing accidental triggering and a bark control component.

BACKGROUND ART

A bark control component or a dog training device is used to be worn around a neck of a pet, generally using electric shock, vibration or emission of sound that makes the pet uncomfortable and other ways to stimulate and punish the pet, so as to achieve the effect of controlling the pet's barks or training the pet. In order to facilitate the control of the bark control component or the dog training device at a certain distance, a remote controller adapted for use with the bark control component or the dog training device is generally equipped. The remote controller is equipped with one or more buttons, and a user can control the bark control component or the dog training device to work by pressing the buttons. However, currently, during the carrying process of the remote controller, the buttons on the remote controller are easy to be accidentally squeezed or pressed, resulting in the problem of accidental triggering, which can cause a bark control component receiver or the dog training device to stimulate the pet after receiving the signal, thereby affecting the user experience.

SUMMARY

The main purpose of the present invention is to provide a remote controller for preventing accidental triggering and a bark control component, for solving the problem that buttons on an existing remote controller adapted for use with a bark control component are easily triggered accidentally.

In order to solve the above technical problem, the technical solution provided by the present invention is as follows:

A remote controller for preventing accidental triggering includes: a first outer housing; a first circuit board provided on the first outer housing, wherein the first circuit board is equipped with a switch; a first wireless module for transmitting a wireless signal, wherein the first wireless module is electrically connected to the first circuit board; stopping blocks arranged on the first outer housing; and a movable member movably arranged on the first outer housing, wherein the movable member is configured to switch between a locked position and a released position when moving relative to the first outer housing.

When the movable member is in the locked position, the movable member is blocked by the stopping block and thus cannot trigger the switch. When the movable member is in the released position, the movable member is disengaged from the limiting of the stopping block and moves in a direction close to the switch under external force to trigger the switch.

Furthermore, position limiting convex blocks are provided at a bottom portion of the movable member, and a pressing part for pressing the switch is provided on the movable member.

The movable member is in the locked position when the position limiting convex block faces a position of the stopping block. When the position limiting convex block does not face the position of the stopping block, the movable member is in the released position. The movable member is configured to drive the pressing part to move close to the switch under external force when in the released position.

Furthermore, two side surfaces of the position limiting convex block and two side surfaces of the stopping block are both guide surfaces. The guide surfaces are cambered surfaces and/or inclined surfaces.

Furthermore, the movable member is rotationally provided on the first outer housing.

Furthermore, the remote controller for preventing accidental triggering further includes a pressing plate. The pressing plate is annular in shape. The switch is positioned in a middle of the pressing plate. The pressing plate is positioned between the first circuit board and the movable member. The pressing plate is arranged inside the first outer housing and forms a position limiting space with the first outer housing. The stopping block is positioned on the pressing plate and is positioned inside the position limiting space. The position limiting convex block and part of the movable member are both placed inside the position limiting space.

Furthermore, a total number of the stopping blocks is multiple, and the stopping blocks are evenly distributed on the pressing plate. The total number of the stopping blocks is identical with a total number of the position limiting convex blocks. A distance between two adjacent stopping blocks is greater than a length of the position limiting convex block. The position limiting convex block is positioned between two stopping blocks when in the released position.

Furthermore, a first engagement component is provided between the stopping block and the position limiting convex block. The first engagement component includes a first fixing position and a first fixing block adapted for use with the first fixing position. The first fixing block is placed in the first fixing position when the movable member is in the locked position.

Furthermore, the first fixing block is arranged at a bottom portion of the position limiting convex block, and the first fixing position is positioned on the stopping block. A surface of the first fixing block and a surface of the first fixing position are both spherical surfaces.

Furthermore, the movable member includes a top panel, a first annular surrounding wall, and a position limiting panel. The first annular surrounding wall is formed by a peripheral side of the top panel extending downwards, and the position limiting panel is formed by the first annular surrounding wall extending outwards. The position limiting panel is placed in the position limiting space, and the position limiting convex block is positioned at a bottom portion of the position limiting panel. The first outer housing is provided with a passing opening at a position corresponding to the position limiting space.

Furthermore, a second annular surrounding wall is provided on the first outer housing. The position limiting space is surrounded and formed by the first outer housing, the second annular surrounding wall, and the pressing plate. A guide opening is defined in the second annular surrounding wall, and the movable member is provided with a guide block. The guide block is placed inside the guide opening.

Furthermore, an insertion opening is defined in the second annular surrounding wall, and an insertion block is provided on the pressing plate. The insertion block is placed inside the insertion opening.

Furthermore, the remote controller for preventing accidental triggering further includes a first elastic member. Two ends of the first elastic member respectively abut against the movable member and the first circuit board.

Furthermore, a top portion of the movable member is provided with an operation convex block for user operation.

Furthermore, the remote controller for preventing accidental triggering further includes a battery. The battery is electrically connected to the first circuit board. The first circuit board is positioned between the movable member and the battery.

Furthermore, the first outer housing includes a first front housing and a first bottom housing. The stopping block is arranged on the first bottom housing, and the movable member is movably arranged on the first front housing.

The first front housing is provided with at least one second fixing block on one side close to the first bottom housing. The first bottom housing is provided with a second fixing position at a position corresponding to the second fixing block. The second fixing block is placed on the second fixing position. The first front housing is locked to the first bottom housing by screws at a position away from the second fixing block.

A bark control component is further provided in this embodiment, including a bark control device and the remote controller as described above. The bark control device includes a second circuit board, a bark control unit for controlling barking, and a second wireless module for communicating with the first wireless module. The bark control unit and the second wireless module are both electrically connected to the second circuit board.

The second circuit board is configured for driving the bark control unit to work when the second circuit board receives a wireless signal transmitted by the first wireless module through the second wireless module.

Furthermore, the bark control device further includes a second outer housing. The second circuit board and the second wireless module are both arranged inside the second outer housing. The bark control unit includes an elastic electrode column. The elastic electrode column includes a conductive base, a second elastic member, and a conductive column.

The conductive base is electrically connected to the second circuit board. The conductive base is arranged on the second outer housing, and the conductive column is slidably provided on the conductive base. The conductive column is at least partially placed outside the second outer housing. Two ends of the second elastic member respectively abut against the conductive column and the conductive base.

Furthermore, the second outer housing includes a second front housing and a second bottom housing. The second front housing and the second bottom housing are connected and form a cavity. The second circuit board and the second wireless module are both disposed inside the cavity.

The second bottom housing is formed by melt injection molding, and the conductive base is fixed during the melt injection molding process. A stopping member is provided on an outer side wall of the conductive base. The stopping member is arranged corresponding to a position of the second bottom housing.

Furthermore, the stopping member includes a first position limiting block and a second position limiting block both positioned on the outer side wall of the conductive base. The first position limiting block and the second position limiting block are spaced apart. A reinforcing cylinder is provided on the second bottom housing. The reinforcing cylinder is provided with a through hole penetrating through the reinforcing cylinder. Two ends of the reinforcing cylinder are each provided with a receiving slot in communication with the through hole. The second bottom housing is integrally formed with the reinforcing cylinder by injection molding, and the conductive base passes through the through hole. The first position limiting block and the second position limiting block are respectively placed in two receiving slots.

Furthermore, the second circuit board is provided with a contact elastic sheet at a position corresponding to the conductive base, and the contact elastic sheet abut against the conductive base.

The present invention has the following beneficial effects: compared with the prior art, in this embodiment, by configuring the movable member, and configuring the movable member to be movable in the locked position and the released position under external force, and to be blocked by the stopping block when the movable member is in the locked position, in this way, when a user does not need to use the remote controller of this embodiment and when the remote controller is carried, the movable member can be adjusted to the locked position to prevent the switch from being triggered when the movable member is squeezed during the carrying process, thereby preventing the bark control device from punishing a pet when there is no need to punish the pet, and improving the user's experience of using the bark control device. When the user needs the remote controller, the movable member can be adjusted to the released position, and then the movable member can be pressed to trigger the switch. When the circuit board receives an electrical signal fed back from the switch being pressed, a control signal is sent to the bark control device through the first wireless module, so that the purpose of using the bark control device to punish the pet is achieved.

BRIEF DESCRIPTION OF THE DRAWINGS

Implementations of the present disclosure will now be described, by way of embodiment, with reference to the attached figures. It should be understood, the drawings are shown for illustrative purpose only, for ordinary person skilled in the art, other drawings obtained from these drawings without paying creative labor by an ordinary person skilled in the art should be within scope of the present disclosure.

DETAILED DESCRIPTION OF THE EMBODIMENTS

Figure 1:
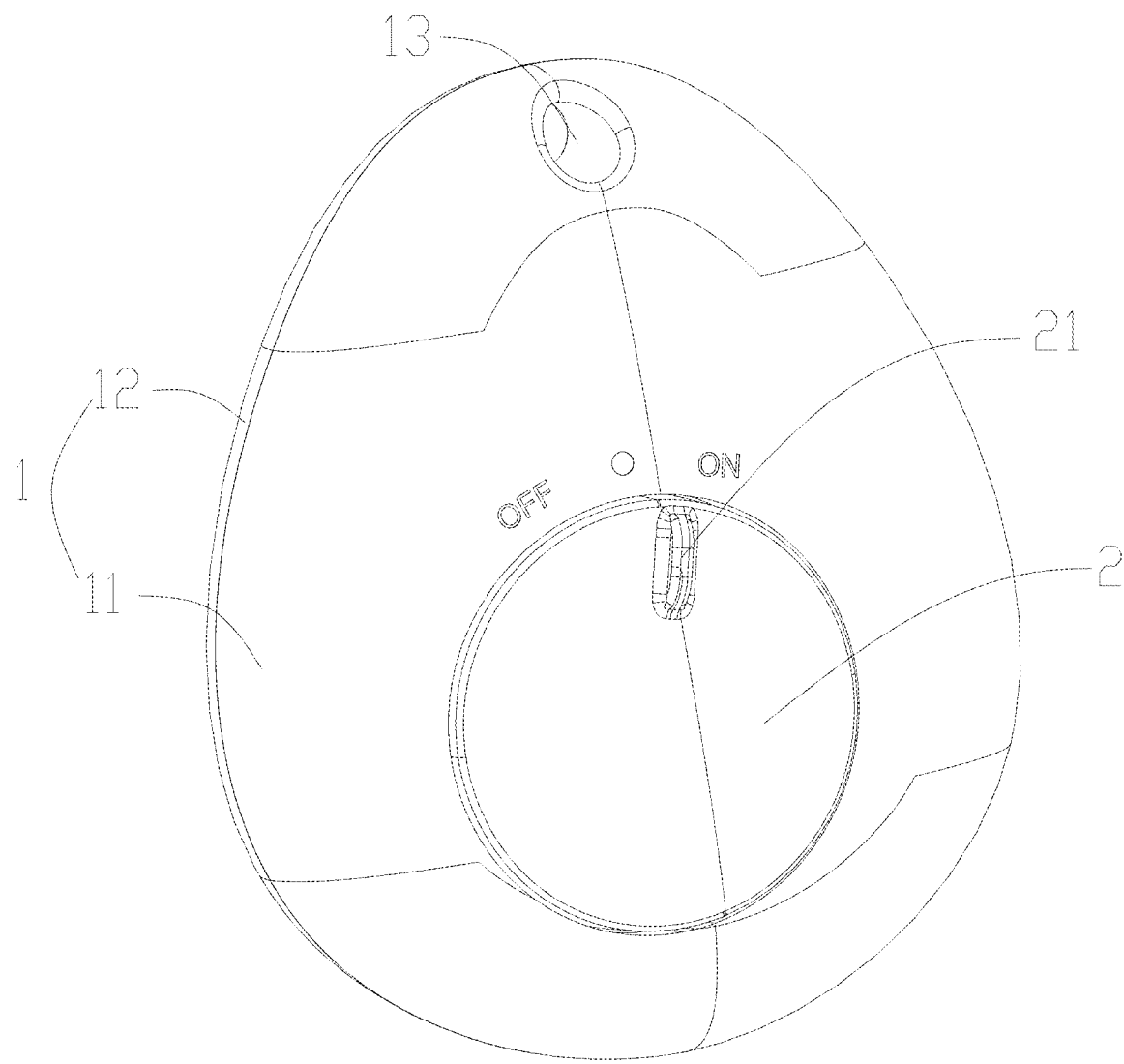
FIG. 1 is a perspective view of a remote controller of the present invention.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". In addition, the terms "first" and "second" are used for descriptive purposes only and cannot be understood as indicating or implying relative importance or implying the number of indicated technical features. Thus, the features defined as "first" and "second" may explicitly or implicitly include one or more of the features. In the description of embodiments of the application, "a plurality of" means two or more, unless otherwise specifically defined.

Figure 2:
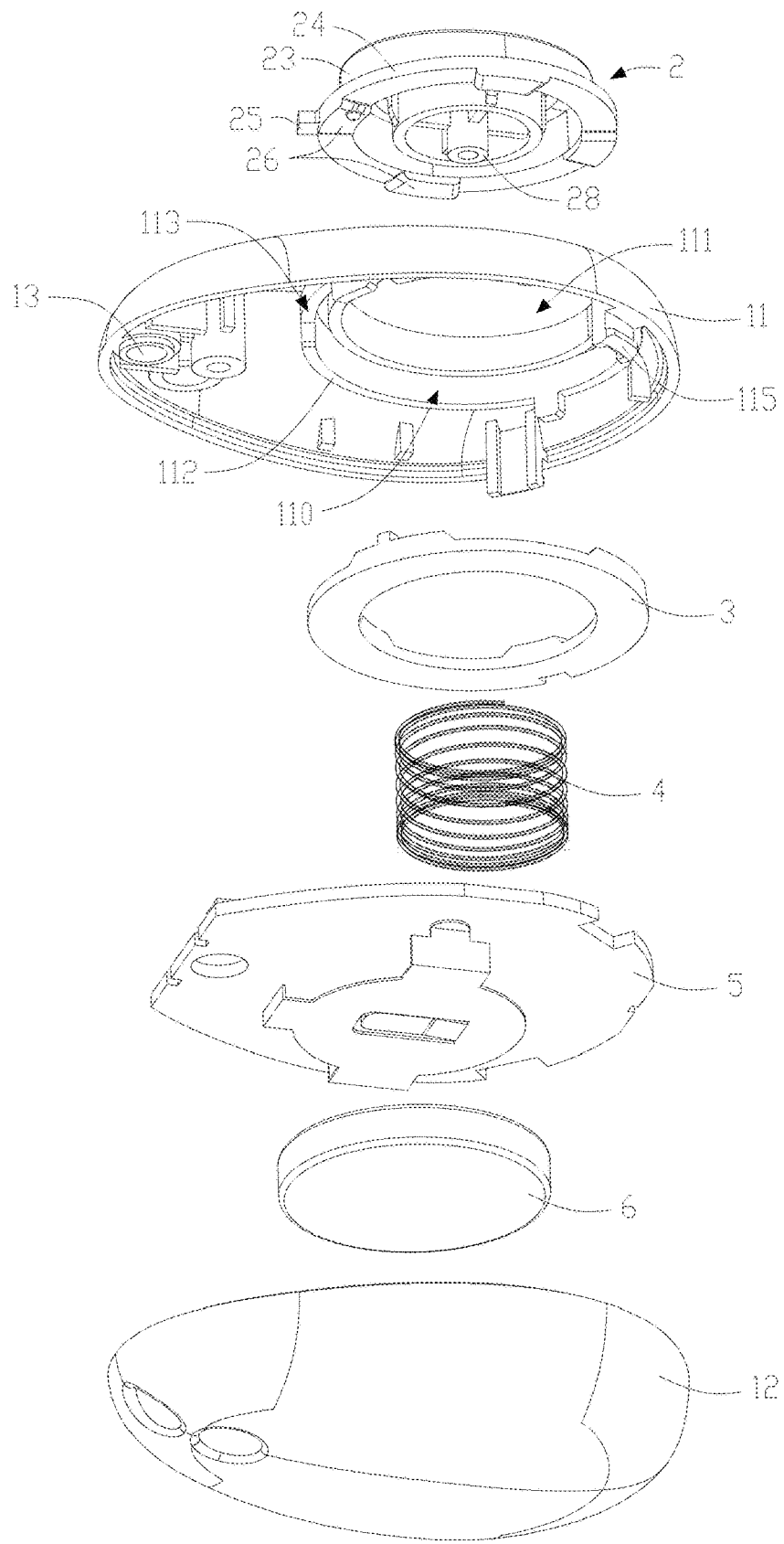
FIG. 2 is an exploded view of a remote controller of the present invention.
Figure 3:
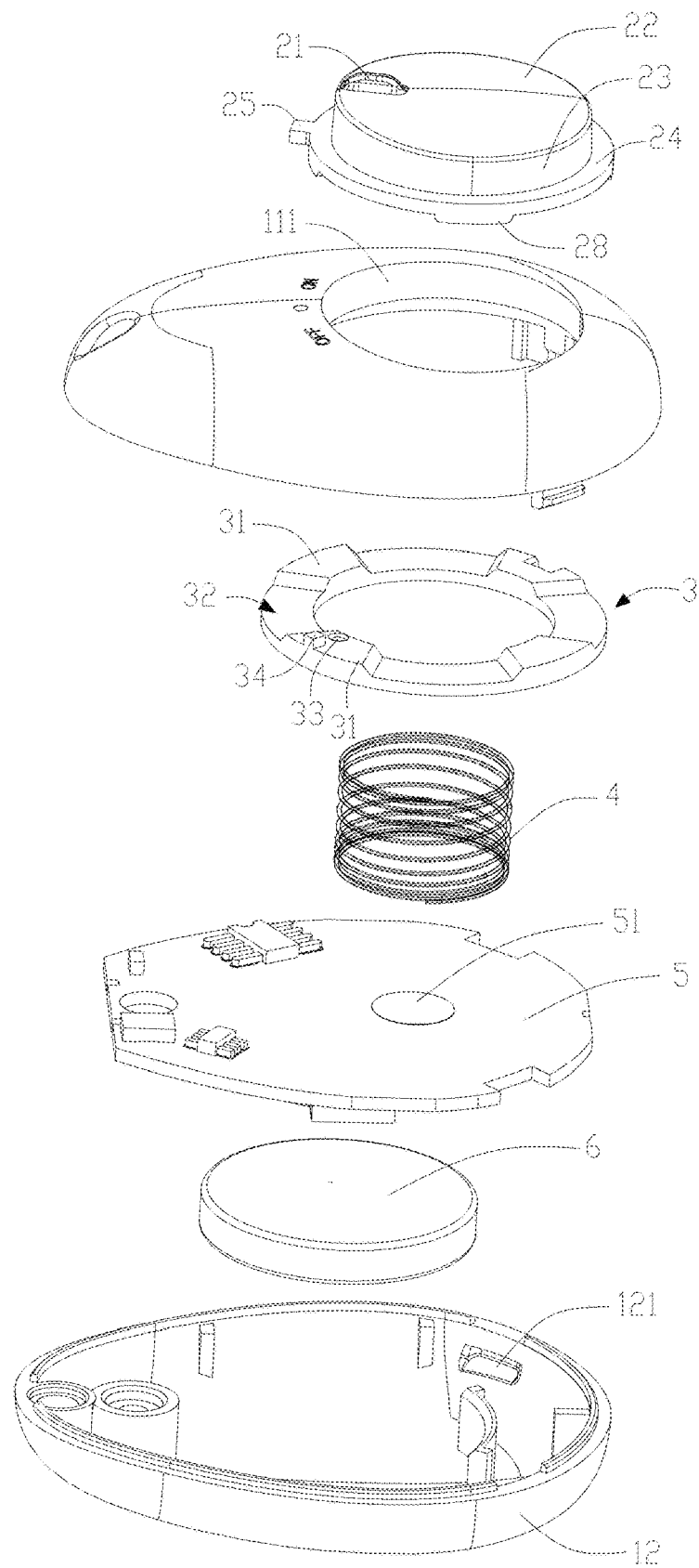
FIG. 3 is an exploded view of a remote controller of the present invention from another angle of view.
Figure 4:
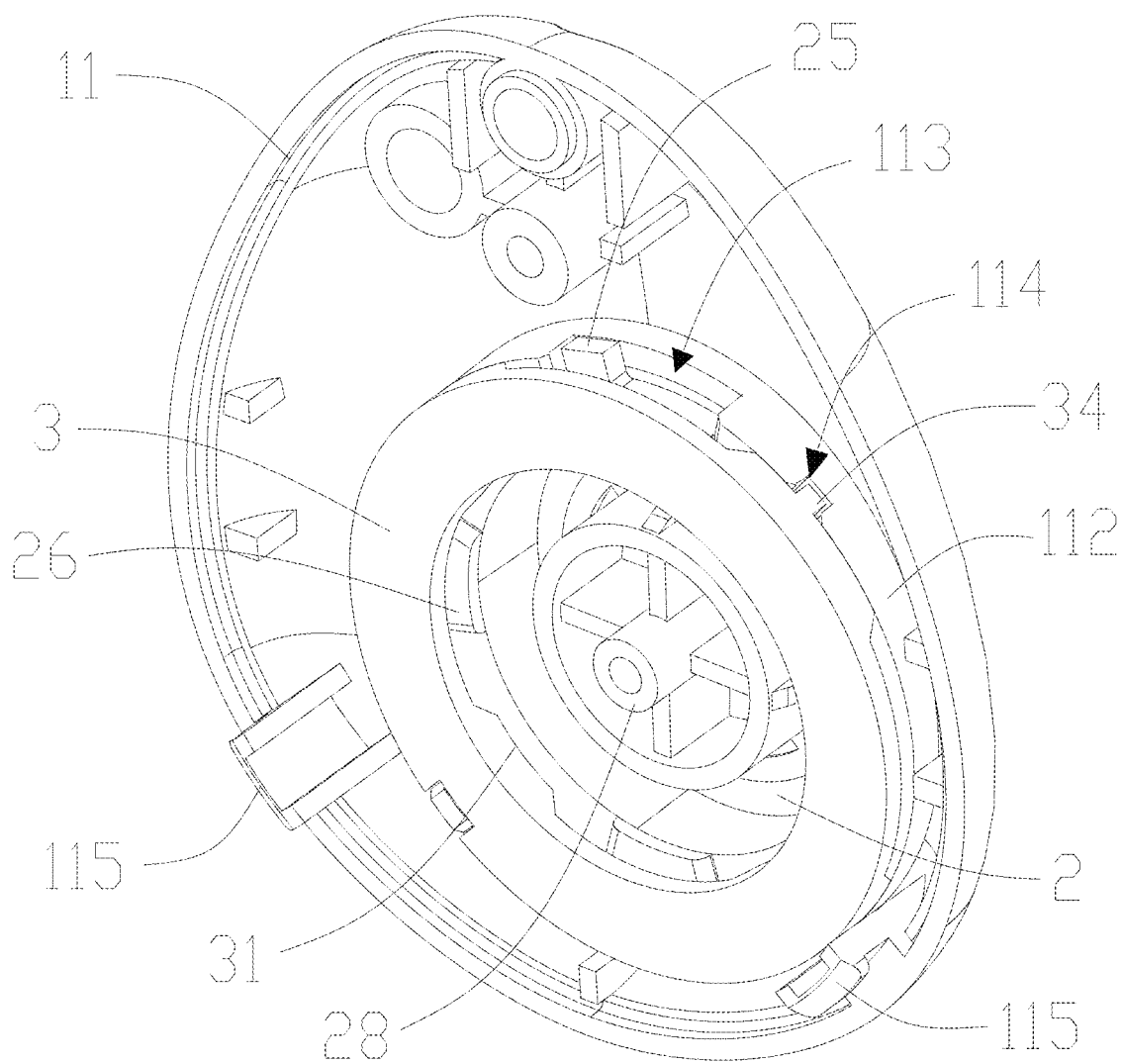
FIG. 4 is an assembly diagram of a movable member, a pressing plate, and a first front housing in a remote controller of the present invention.
Figure 5:
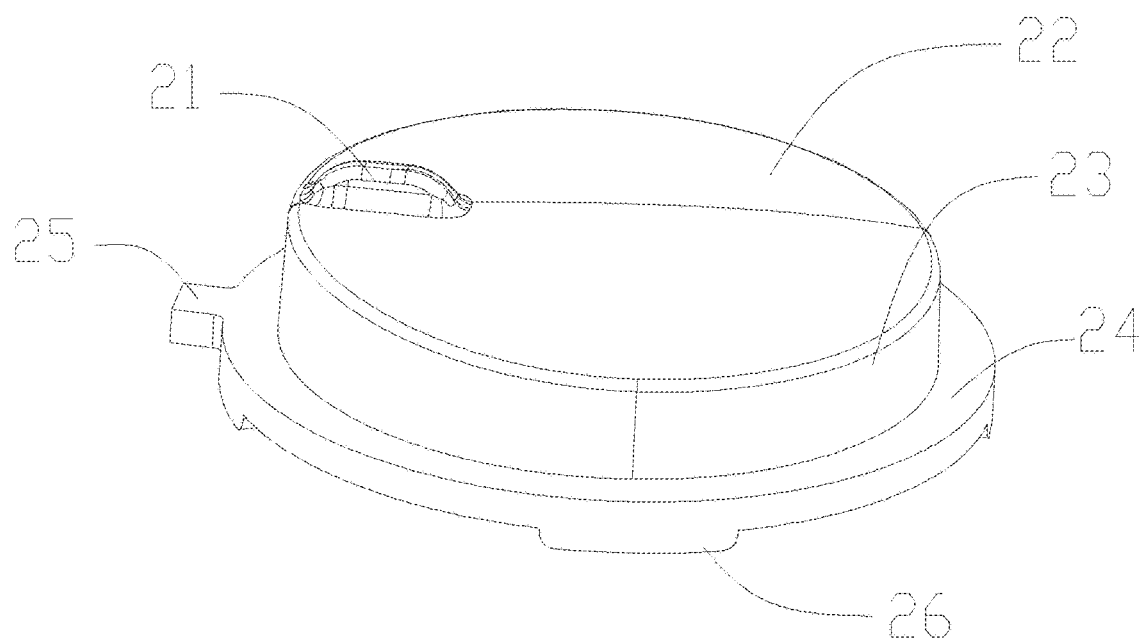
FIG. 5 is a structural diagram of a movable member of the present invention.
Figure 6:
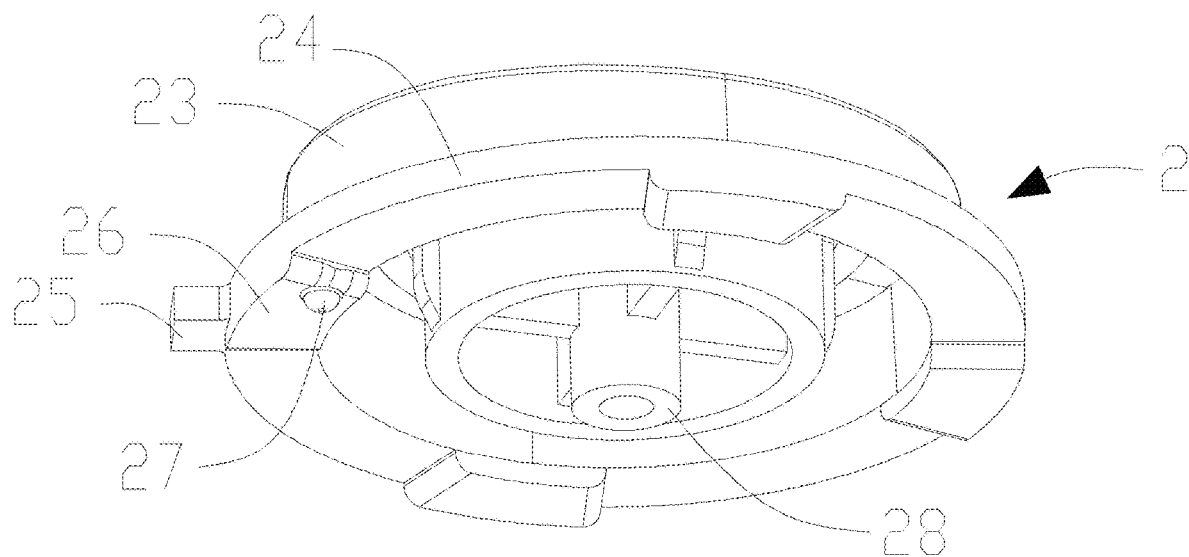
FIG. 6 is a structural diagram of a movable member of the present invention from another angle of view.
Figure 7:
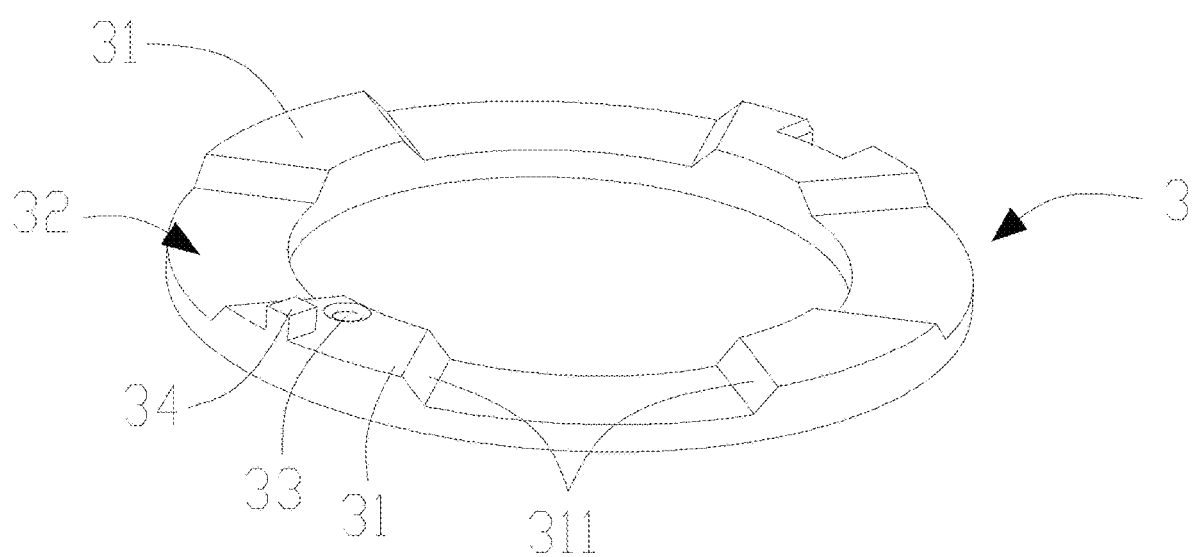
FIG. 7 is a structural diagram of a pressing plate of the present invention.
Figure 8:
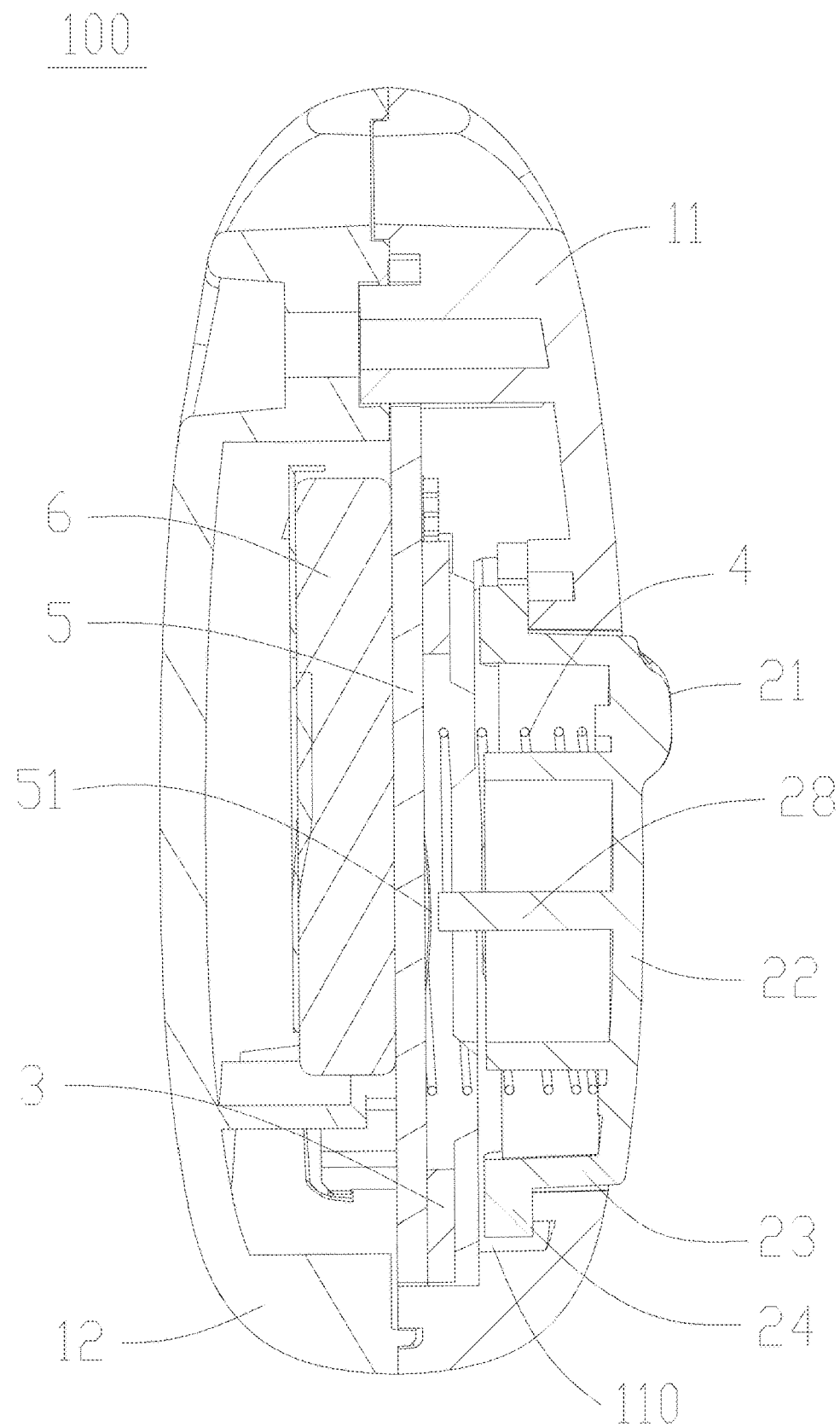
FIG. 8 is a sectional view of a remote controller of the present invention taken along a central axis direction of a first elastic member.
Figure 12:
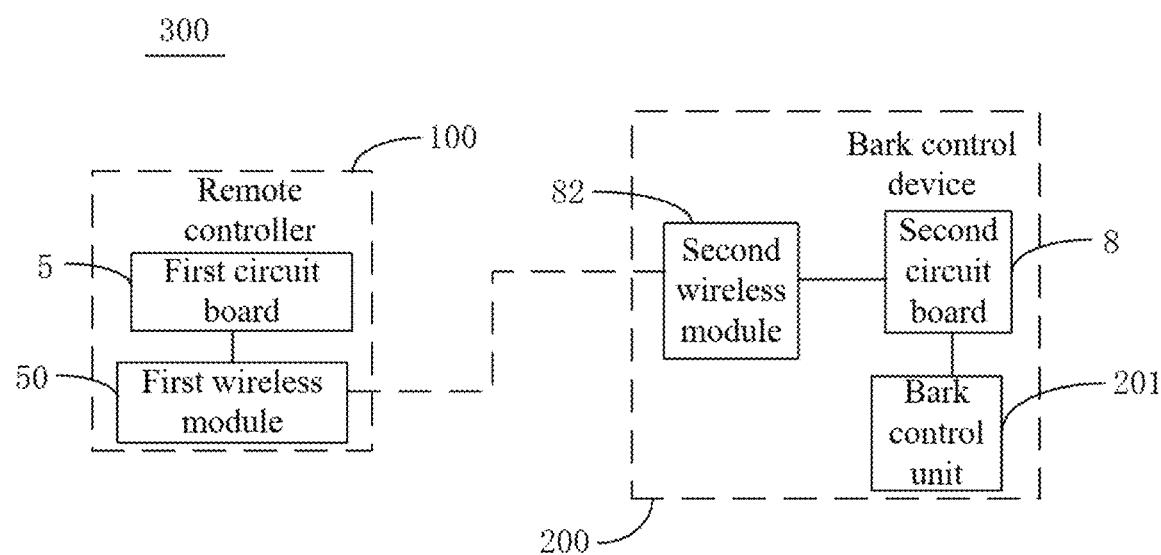
FIG. 12 is a principle block diagram of wireless connection of a bark control component of the present invention.

FIGS. 1-8 and FIG. 12 show a remote controller 100 for preventing accidental triggering in the present embodiment.

The remote controller 100 for preventing accidental triggering includes: a first outer housing 1; a first circuit board 5 provided on the first outer housing 1, wherein the first circuit board 5 is equipped with a switch 51; a first wireless module 50 for transmitting a wireless signal, wherein the first wireless module 50 is electrically connected to the first circuit board 5; stopping blocks 31 arranged on the first outer housing 1; and a movable member 2 movably arranged on the first outer housing 1, wherein the movable member 2 is configured to switch between a locked position and a released position when moving relative to the first outer housing 1. When the movable member 2 is in the locked position, the movable member 2 is blocked by the stopping block 31 and thus cannot trigger the switch 51. When the movable member 2 is in the released position, the movable member 2 is disengaged from the limiting of the stopping block 31 and moves in a direction close to the switch 51 under external force to trigger the switch 51.

In this embodiment, by configuring the movable member 2, and configuring the movable member 2 to be movable in the locked position and the released position under external force, and to be blocked by the stopping block 31 when the movable member 2 is in the locked position, in this way, when a user does not need to use the remote controller 100 of this embodiment and when the remote controller 100 is carried, the movable member 2 can be adjusted to the locked position to prevent the switch 51 from being triggered when the movable member 2 is squeezed during the carrying process, playing the role of preventing the switch 51 from being triggered accidentally, and thus preventing a bark control device 200 from punishing a pet when there is no need to punish the pet, improving the user's experience of using the bark control device 200. When the user needs the remote controller 100, the movable member 2 can be adjusted to the released position, and then the movable member 2 can be pressed to trigger the switch 51. When the circuit board receives an electrical signal fed back from the switch 51 being pressed, a control signal is sent to the bark control device 200 through the first wireless module 50, so that the purpose of using the bark control device 200 to punish the pet is achieved.

In one embodiment, position limiting convex blocks 26 are provided at a bottom portion of the movable member 2, and a pressing part 28 for pressing the switch 51 is provided on the movable member 2. The movable member 2 is in the locked position when the position limiting convex block 26 faces a position of the stopping block 31, in this state, when the movable member 2 is pressed or squeezed, the movable member 2 will not move close to the switch 51 under the action of the position limiting convex block 26 and the stopping block 31. When the position limiting convex block 26 does not face the position of the stopping block 31, the movable member 2 is in the released position. At this time, when the movable member 2 is squeezed or pressed by external force, the movable member 2 can drive the pressing part 28 to move close to the switch 51 and trigger the switch 51, so that the user can operate and use the remote controller 100 of this embodiment.

In one embodiment, two side surfaces of the position limiting convex block 26 and two side surfaces of the stopping block 31 are both guide surfaces 311. The guide surfaces 311 can be cambered surfaces or inclined surfaces. Alternatively, the guide surfaces 311 can also be a combination of inclined surfaces and cambered surfaces. By utilizing the guide surfaces 311, the horizontal movement of the movable member 2 can be made smoother.

In one embodiment, when the stopping block 31 faces the position limiting convex block 26, the stopping block 31 and the position limiting convex block 26 are in a mutually squeezed state, so that there is no gap between the stopping block 31 and the position limiting convex block 26, so as to achieve the positioning of a rotating position of the movable member 2, and to prevent the phenomenon of the movable member 2 moving when the remote controller 100 in this embodiment shakes during carrying.

In one embodiment, the movable member 2 is rotationally provided on the first outer housing 1, that is, when the movable member 2 rotates under external force, the movable member 2 can switch between the released position and the locked position.

In one embodiment, the remote controller 100 for preventing accidental triggering further includes a pressing plate 3. The pressing plate 3 is annular in shape. The switch 51 is positioned in a middle of the pressing plate 3. The pressing plate 3 is positioned between the first circuit board 5 and the movable member 2. The pressing plate 3 is arranged inside the first outer housing 1 and forms a position limiting space 110 with the first outer housing 1. The stopping block 31 is positioned on the pressing plate 3 and is positioned inside the position limiting space 110. The position limiting convex block 26 and part of the movable member 2 are both placed inside the position limiting space 110. The first outer housing 1 is provided with a passing opening 111 at a position corresponding to the position limiting space 110. The position limiting space 110 is used for limiting a movement position of the movable member 2, and the passing opening 111 is used for displaying the movable member 2, thereby facilitating the operation and use of the movable member 2 by the user.

In one embodiment, in order to improve the compactness of the structure of this embodiment and enhance the strength of the structure of the movable member 2 and the pressing plate 3, a total number of the stopping blocks 31 is multiple, and the stopping blocks 31 are evenly distributed on the pressing plate 3. The total number of the stopping blocks 31 is identical with a total number of the position limiting convex blocks 26. A distance between two adjacent stopping blocks 31 is greater than a length of the position limiting convex block 26. The position limiting convex block 26 is positioned between two stopping blocks 31 when in the released position.

In one embodiment, a first engagement component is provided between the stopping block 31 and the position limiting convex block 26. The first engagement component includes a first fixing position 33 and a first fixing block 27 adapted for use with the first fixing position 33. The first fixing block 27 is placed in the first fixing position 33 when the movable member 2 is in the locked position, which can further improve the relative position between the movable member 2 and the first outer housing 1 in the locked position.

Specifically, the first fixing position 33 is a groove. The first fixing block 27 is arranged at a bottom portion of the position limiting convex block 26, and the first fixing position 33 is positioned on the stopping block 31. Of course, the first fixing block 27 can also be arranged on the stopping block 31, and the first fixing position 33 can also be positioned at the bottom portion of the position limiting convex block 26. A surface of the first fixing block 27 and a surface of the first fixing position 33 can both be spherical surfaces, or a cross-section of the first fixing block 27 and a cross-section of the first fixing position 33 can be trapezoidal or conical, etc., so that the first fixing block 27 is placed inside the first fixing position 33.

In one embodiment, the movable member 2 includes a top panel 22, a first annular surrounding wall 23, and a position limiting panel 24. The first annular surrounding wall 23 is formed by a peripheral side of the top panel 22 extending downwards, and the position limiting panel 24 is formed by the first annular surrounding wall 23 extending outwards. The position limiting panel 24 is placed in the position limiting space 110, and the position limiting convex block 26 is positioned at a bottom portion of the position limiting panel 24. The first annular surrounding wall 23 is placed in the passing opening 111, so as to enable the movable member 2 to be movably arranged on the first outer housing 1. Moreover, this structural design can make the structure of the remote controller 100 in this embodiment more compact.

In one embodiment, a second annular surrounding wall 112 is provided on the first outer housing 1. The position limiting space 110 is surrounded and formed by the first outer housing 1, the second annular surrounding wall 112, and the pressing plate 3. A guide opening 113 is defined in the second annular surrounding wall 112, and the movable member 2 is provided with a guide block 25. The guide block 25 is placed inside the guide opening 113. The guide block 25 is used in conjunction with the guide opening 113, and the guide opening 113 is used for limiting a movement distance of the movable member 2 in the locked position and the released position, which can facilitate the operation and use of the movable member 2, and can improve the stability of the movement of the movable member 2.

In one embodiment, an insertion opening 114 is defined in the second annular surrounding wall 112, and an insertion block 34 is provided on the pressing plate 3. The insertion block 34 is placed inside the insertion opening 114, so that the pressing plate 3 will not be driven to rotate together when the movable member 2 rotates, and the stability of the connection between the pressing plate 3 and the first outer housing 1 can be improved.

In other embodiments, the movable member 2 may also be configured without the position limiting convex block 26. Specifically, the movable member 2 can be provided with a hole, and an opening size of a through hole is larger than an outer shape of the stopping block 31. That is, when in the released position, the stopping block 31 is placed inside the hole, and the hole is used for avoiding the stopping block 31, which can also realize that the movable member 2 disengages from the limiting of the stopping block 31 and moves close to the switch 51 under external force, so as to trigger the switch 51.

In one embodiment, the remote controller 100 for preventing accidental triggering further includes a first elastic member 4. Two ends of the first elastic member 4 respectively abut against the movable member 2 and the first circuit board 5. The first elastic member 4 is used for providing a force for the movable member 2 to move away from the first circuit board 5, so that after the user triggers the switch 51 through the movable member 2, the movable member 2 can be restored. Specifically, the first elastic member 4 can be a spring, an elastic sheet, or the like.

In one embodiment, a top portion of the movable member 2 is provided with an operation convex block 21 for user operation, so that the user can rotate the movable member 2.

In one embodiment, the remote controller 100 for preventing accidental triggering further includes a battery 6. The battery 6 is electrically connected to the first circuit board 5. The first circuit board 5 is positioned between the movable member 2 and the battery 6. The battery 6 is used for supplying power to the first circuit board 5, so that the remote controller 100 of this embodiment can work effectively.

Specifically, the battery 6 can be a button battery 6. The button battery 6 has a small volume, which can effectively reduce a volume of the remote controller 100 in this embodiment, making it convenient for the user to carry. Of course, in other embodiments, the battery 6 can also be a dry battery 6 or a rechargeable battery 6, such as a lithium battery 6, a polymer battery 6, etc.

In one embodiment, the first outer housing 1 includes a first front housing 11 and a first bottom housing 12 connected to the first front housing 11. The stopping block 31 is arranged on the first bottom housing 12, and the movable member 2 is movably arranged on the first front housing 11. The first front housing 11 is connected to the first bottom housing 12, which can press and fix the battery 6, the first circuit board 5, and the pressing plate 3, so that the first circuit board 5 and the pressing plate 3 can be prevented from shaking.

In one embodiment, the first front housing 11 is provided with at least one second fixing block 115 on one side close to the first bottom housing 12. The first bottom housing 12 is provided with a second fixing position 121 at a position corresponding to the second fixing block 115. The second fixing block 115 is placed on the second fixing position 121. The first front housing 11 is locked to the first bottom housing 12 by screws at a position away from the second fixing block 115. With screws, the first front housing 11 and the first bottom housing 12 can be stably connected. One end is connected with a fixing buckle, and an opposite end is locked with screws, which can reduce a total number of screws and facilitate the user to install and remove the first front housing 11 and the first bottom housing 12. Of course, in other embodiments, the first front housing 11 can also be connected by fully using screws or fixing buckles, or connected by snap-fit, pasting, or other methods.

In other embodiments, the movable member 2 can also be slidably arranged on the first outer housing 1. It can also realize that when the movable member 2 is in the locked position, the stopping block 31 is used to stop the movable member 2 from moving close to the switch 51. When in the released position, the movable member 2 is not restricted by the stopping block 31 so as to approach the switch 51 under external force and trigger the switch 51, and the control signal is transmitted by the first circuit board 5 through the first wireless module 50.

In one embodiment, the first outer housing 1 is provided with a hanging hole 13. The hanging hole 13 can be used in conjunction with hanging ropes, key rings, etc., making it convenient for the user to carry the remote controller 100 of this embodiment.

Figure 9:
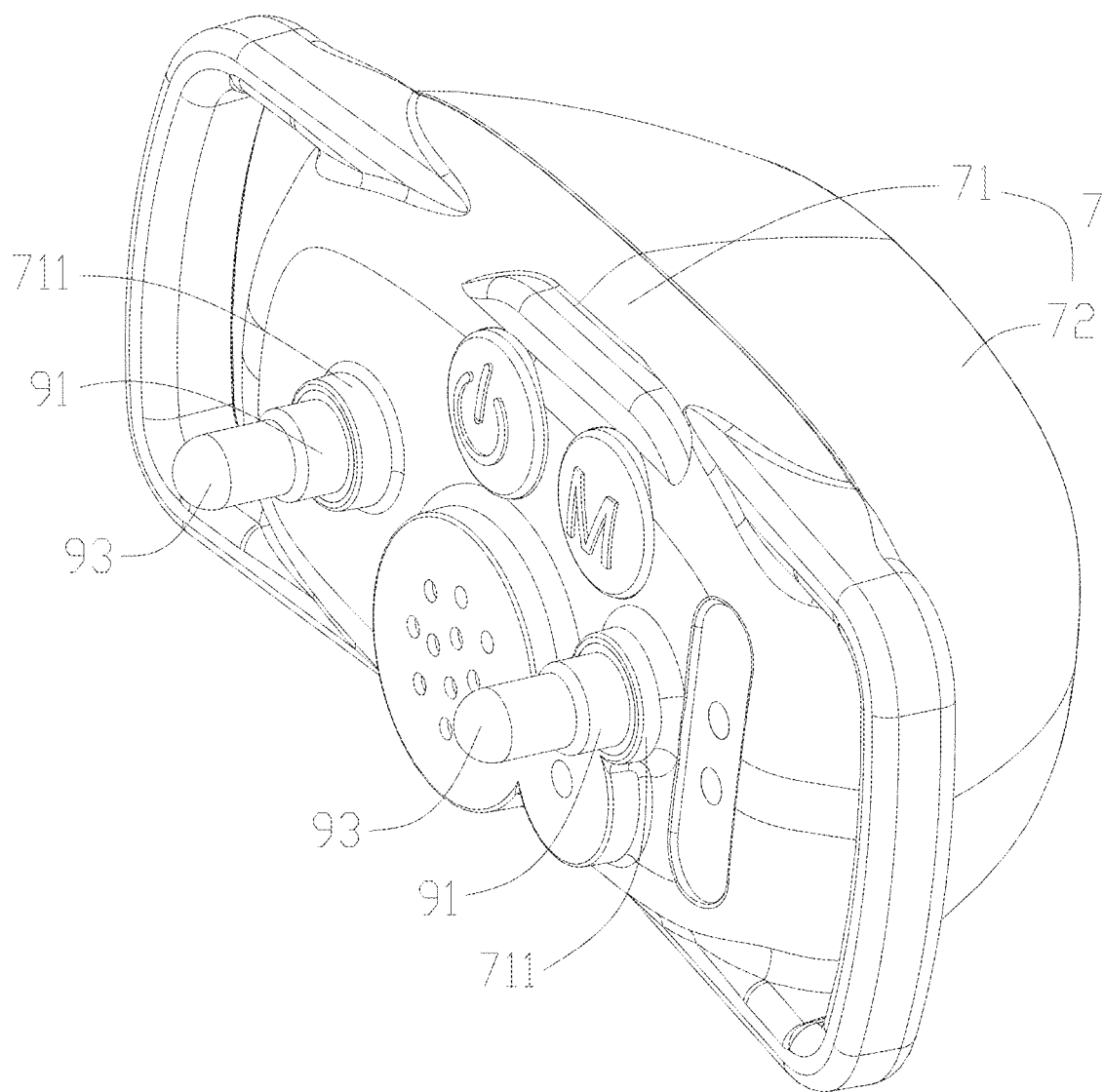
FIG. 9 is a perspective view of a bark control device of the present invention.
Figure 10:
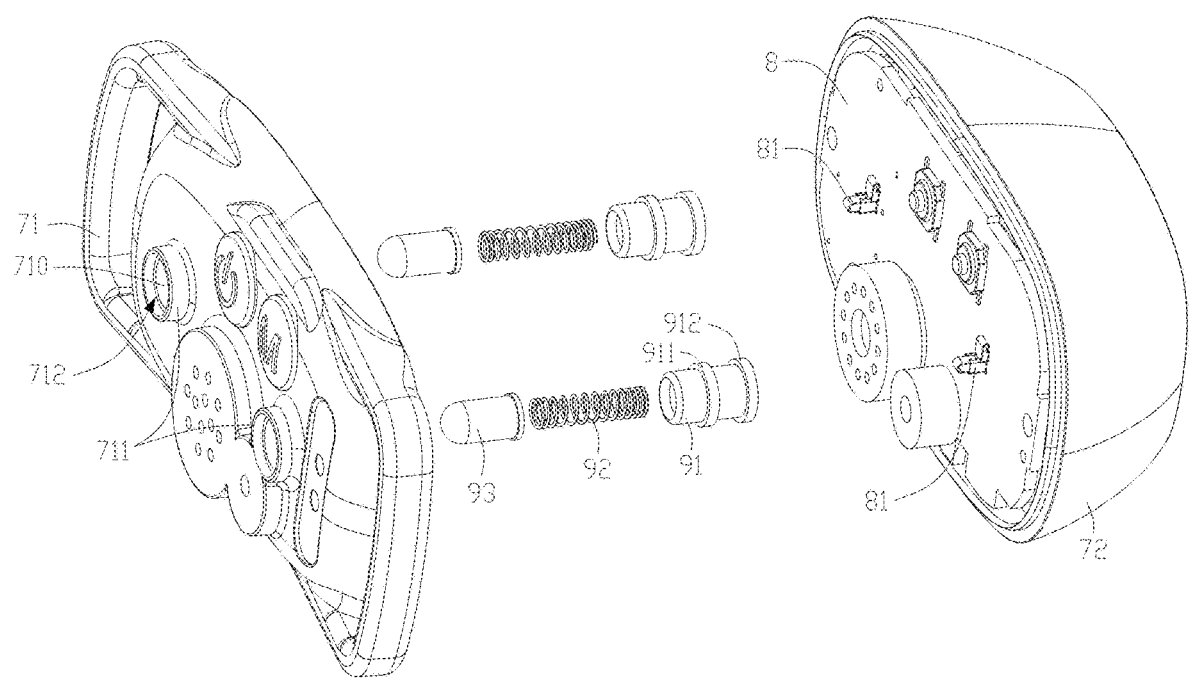
FIG. 10 is a partially exploded view of a bark control device of the present invention.
Figure 11:
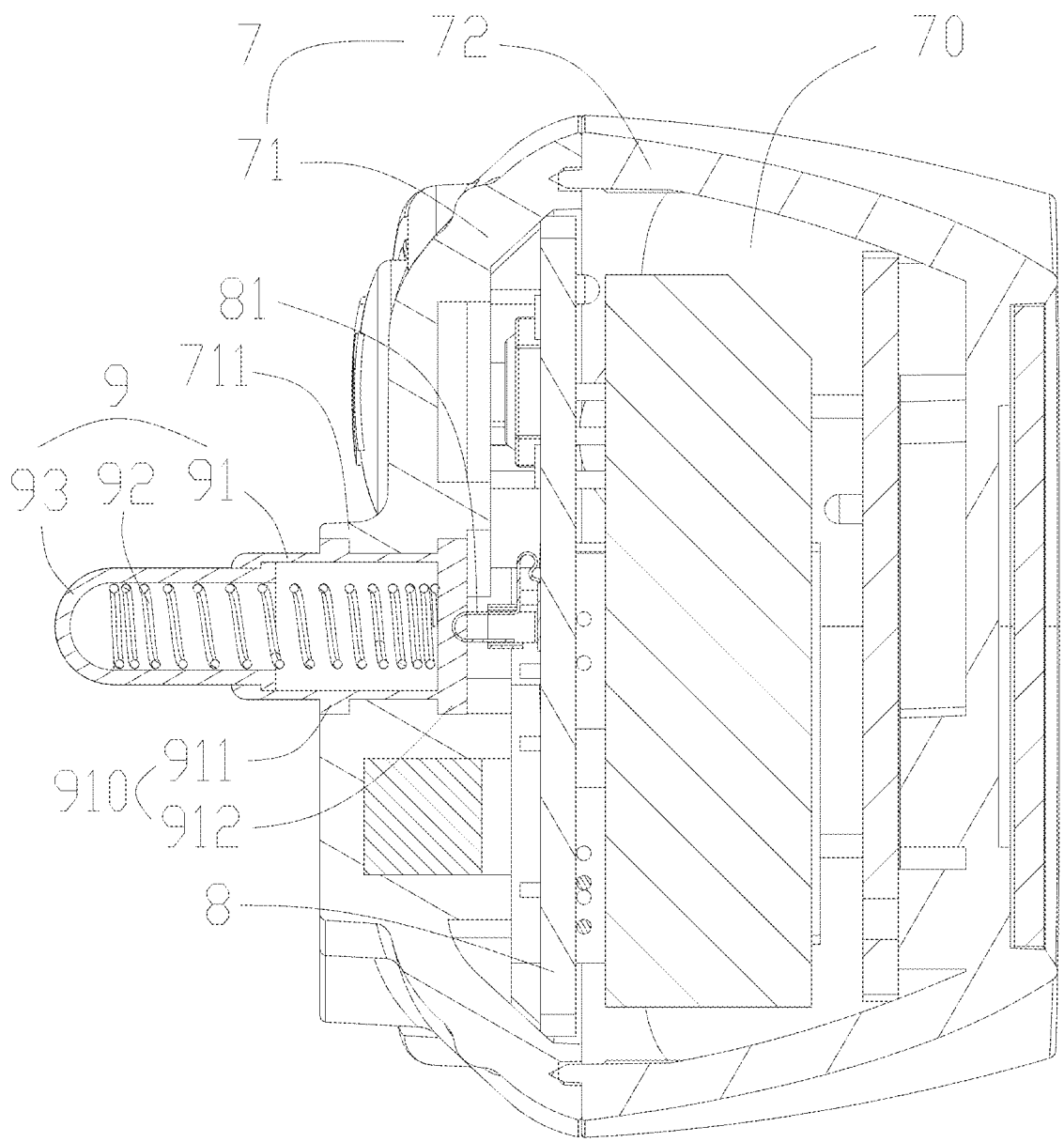
FIG. 11 is a sectional view of a bark control device of the present invention taken along a central axis direction of a second elastic member.

Referring to FIGS. 9-12, based on the aforementioned remote controller 100, a bark control component 300 is further provided in this embodiment, including a bark control device 200 and the remote controller 100 as described in any of the aforementioned embodiments. The bark control device 200 includes a second circuit board 8, a bark control unit 201 for controlling barking, and a second wireless module 82 for communicating with the first wireless module 50. The bark control unit 201 and the second wireless module 82 are both electrically connected to the second circuit board 8.

In this way, when the user uses the remote controller 100, i.e. presses the movable member 2 to trigger the switch 51, the first circuit board 5 detects an electrical signal from the switch 51 being triggered. The first circuit board 5 transmits a wireless signal through the first wireless module 50. The second circuit board 8 receives the wireless signal transmitted by the first wireless module 50 through the second wireless module 82, and drives the bark control unit 201 to work when receiving the wireless signal, so as to play a role of punishing the pet. After the pet is stimulated, the instinctive fear will make the pet stop barking, thus achieving an effect of controlling barking.

Specifically, the first wireless module 50 can be an infrared transmitter module, a Bluetooth module, a 3G module, a WIFI module, etc. The second wireless module 82 can be an infrared receiver module, a Bluetooth module, a 3G module, a WIFI module, etc. Moreover, the first wireless module 50 can be provided on the first circuit board or independently as a PCB board, etc. The second wireless module 82 can be provided on the second circuit board 8 or independently as a PCB board, etc.

In one embodiment, the bark control device 200 further includes a second outer housing 7. The second circuit board 8 and the second wireless module 82 are both arranged inside the second outer housing 7. The bark control unit 201 includes an elastic electrode column 9. The elastic electrode column 9 includes a conductive base 91, a second elastic member 92, and a conductive column 93. The conductive base 91 is electrically connected to the second circuit board 8. The conductive base 91 is arranged on the second outer housing 7, and the conductive column 93 is slidably provided on the conductive base 91. The conductive column 93 is at least partially placed outside the second outer housing 7. Two ends of the second elastic member 92 respectively abut against the conductive column 93 and the conductive base 91. When the bark control device 200 of this embodiment is worn on a neck of a pet, the conductive column 93 comes into contact with the pet. Therefore, when the second circuit board 8 drives the elastic electrode column 9 to work, that is, the second circuit board 8 outputs a voltage for stimulating the pet to the elastic electrode column 9, so as to achieve the effect of controlling barking. Moreover, by using the second elastic member 92, the conductive column 93 can be tightly attached to the pet's skin while preventing the conductive column 93 from coming into stiff contact with the pet, thereby improving the comfort of wearing the bark control device 200. Specifically, both the conductive base 91 and the conductive column 93 are made of conductive materials.

In one embodiment, the second outer housing 7 includes a second front housing 71 and a second bottom housing 72. The second front housing 71 and the second bottom housing 72 are connected and form a cavity 70. The second circuit board 8 and the second wireless module 82 are both disposed inside the cavity 70. The second bottom housing 72 is formed by melt injection molding, and the conductive base 91 is fixed during the melt injection molding process. A stopping member 910 is provided on an outer side wall of the conductive base 91. The stopping member 910 is arranged corresponding to a position of the second bottom housing 72. In this way, the elastic electrode column 9 can be fixed on the second bottom housing 72, and a gap between the conductive base 91 and the second bottom housing 72 can be prevented, providing a sealing effect and thus playing a waterproof role. Through the stopping member 910, a contact area between the conductive base 91 and the second bottom housing 72 can be increased, effectively improving the stability of the connection between the conductive base 91 and the second bottom housing 72.

In one embodiment, the stopping member 910 includes a first position limiting block 911 and a second position limiting block 912 both positioned on the outer side wall of the conductive base 91. The first position limiting block 911 and the second position limiting block 912 are spaced apart. A reinforcing cylinder 711 is provided on the second bottom housing 72. The reinforcing cylinder 711 is provided with a through hole 710 penetrating through the reinforcing cylinder 711. Two ends of the reinforcing cylinder 711 are each provided with a receiving slot 712 in communication with the through hole 710. The second bottom housing 72 is integrally formed with the reinforcing cylinder 711 by injection molding, and the conductive base 91 passes through the through hole 710. The first position limiting block 911 and the second position limiting block 912 are respectively placed in two receiving slots 712. By using the reinforcing cylinder 711, the first position limiting block 911, and the second position limiting block 912, the stability of the connection between the conductive base 91 and the second bottom housing 72 can be further improved, and the conductive base 91 can be effectively prevented from falling off from the second bottom housing 72.

In one embodiment, the second circuit board 8 is provided with a contact elastic sheet 81 at a position corresponding to the conductive base 91, and the contact elastic sheet 81 abut against the conductive base 91. The contact elastic sheet 81 has elasticity, so that when the second circuit board 8 is installed inside the second outer housing 7, by abutting the contact elastic sheet 81 against the conductive base 91, the second circuit board 8 can be electrically connected to the conductive base 91. This connection method is simple and facilitates the assembly of the bark control device 200 in this embodiment.

The above description only describes embodiments of the present disclosure, and is not intended to limit the present disclosure; various modifications and changes can be made to the present disclosure. Any modifications, equivalent substitutions, and improvements made within the spirit and scope of the present disclosure are intended to be included within the scope of the present disclosure.

What is claimed is:

1. A remote controller for preventing accidental triggering, comprising:
    a first outer housing;
    a first circuit board provided on the first outer housing, wherein the first circuit board is equipped with a switch;
    a first wireless module for transmitting a wireless signal, wherein the first wireless module is electrically connected to the first circuit board;
    stopping blocks arranged on the first outer housing; and
    a movable member movably arranged on the first outer housing, wherein the movable member is configured to switch between a locked position and a released position when moving relative to the first outer housing;
    wherein when the movable member is in the locked position, the movable member is blocked by the stopping block and thus cannot trigger the switch; when the movable member is in the released position, the movable member is disengaged from the limiting of the stopping block and moves in a direction close to the switch under external force to trigger the switch.

2. The remote controller for preventing accidental triggering according to claim 1, wherein position limiting convex blocks are provided at a bottom portion of the movable member, and a pressing part for pressing the switch is provided on the movable member;
    the movable member is in the locked position when the position limiting convex block faces a position of the stopping block; when the position limiting convex block does not face the position of the stopping block, the movable member is in the released position; and the movable member is configured to drive the pressing part to move close to the switch under external force when in the released position.

3. The remote controller for preventing accidental triggering according to claim 2, wherein two side surfaces of the position limiting convex block and two side surfaces of the stopping block are both guide surfaces, and the guide surfaces are cambered surfaces and/or inclined surfaces.

4. The remote controller for preventing accidental triggering according to claim 2, wherein the movable member is rotationally provided on the first outer housing.

5. The remote controller for preventing accidental triggering according to claim 4, further comprising a pressing plate, wherein the pressing plate is annular in shape, the switch is positioned in a middle of the pressing plate, the pressing plate is positioned between the first circuit board and the movable member, the pressing plate is arranged inside the first outer housing and forms a position limiting space with the first outer housing, the stopping block is positioned on the pressing plate and is positioned inside the position limiting space, and the position limiting convex block and part of the movable member are both placed inside the position limiting space.

6. The remote controller for preventing accidental triggering according to claim 5, wherein a total number of the stopping blocks is multiple, and the stopping blocks are evenly distributed on the pressing plate; the total number of the stopping blocks is identical with a total number of the position limiting convex blocks, a distance between two adjacent stopping blocks is greater than a length of the position limiting convex block, and the position limiting convex block is positioned between two stopping blocks when in the released position.

7. The remote controller for preventing accidental triggering according to claim 5, wherein a first engagement component is provided between the stopping block and the position limiting convex block, the first engagement component comprises a first fixing position and a first fixing block adapted for use with the first fixing position, and the first fixing block is placed in the first fixing position when the movable member is in the locked position.

8. The remote controller for preventing accidental triggering according to claim 7, wherein the first fixing block is arranged at a bottom portion of the position limiting convex block, the first fixing position is positioned on the stopping block, and a surface of the first fixing block and a surface of the first fixing position are both spherical surfaces.

9. The remote controller for preventing accidental triggering according to claim 5, wherein the movable member comprises a top panel, a first annular surrounding wall, and a position limiting panel; the first annular surrounding wall is formed by a peripheral side of the top panel extending downwards, the position limiting panel is formed by the first annular surrounding wall extending outwards, the position limiting panel is placed in the position limiting space, the position limiting convex block is positioned at a bottom portion of the position limiting panel, and the first outer housing is provided with a passing opening at a position corresponding to the position limiting space.

10. The remote controller for preventing accidental triggering according to claim 5, wherein a second annular surrounding wall is provided on the first outer housing; the position limiting space is surrounded and formed by the first outer housing, the second annular surrounding wall, and the pressing plate; a guide opening is defined in the second annular surrounding wall, the movable member is provided with a guide block, and the guide block is placed inside the guide opening.

11. The remote controller for preventing accidental triggering according to claim 10, wherein an insertion opening is defined in the second annular surrounding wall, an insertion block is provided on the pressing plate, and the insertion block is placed inside the insertion opening.

12. The remote controller for preventing accidental triggering according to claim 1, further comprising a first elastic member, wherein two ends of the first elastic member respectively abut against the movable member and the first circuit board.

13. The remote controller for preventing accidental triggering according to claim 1, wherein a top portion of the movable member is provided with an operation convex block for user operation.

14. The remote controller for preventing accidental triggering according to claim 1, further comprising a battery, wherein the battery is electrically connected to the first circuit board, and the first circuit board is positioned between the movable member and the battery.

15. The remote controller for preventing accidental triggering according to claim 1, wherein the first outer housing comprises a first front housing and a first bottom housing, the stopping block is arranged on the first bottom housing, and the movable member is movably arranged on the first front housing;
the first front housing is provided with at least one second fixing block on one side close to the first bottom housing, the first bottom housing is provided with a second fixing position at a position corresponding to the second fixing block, the second fixing block is placed on the second fixing position, and the first front housing is locked to the first bottom housing by screws at a position away from the second fixing block.

16. A bark control component, comprising a bark control device and the remote controller as described in claim 1; wherein the bark control device comprises a second circuit board, a bark control unit for controlling barking, and a second wireless module for communicating with the first wireless module; and the bark control unit and the second wireless module are both electrically connected to the second circuit board;
the second circuit board is configured for driving the bark control unit to work when the second circuit board receives a wireless signal transmitted by the first wireless module through the second wireless module.

17. The bark control component according to claim 16, wherein the bark control device further comprises a second outer housing, and the second circuit board and the second wireless module are both arranged inside the second outer housing; the bark control unit comprises an elastic electrode column; and the elastic electrode column comprises a conductive base, a second elastic member, and a conductive column;
the conductive base is electrically connected to the second circuit board, the conductive base is arranged on the second outer housing, the conductive column is slidably provided on the conductive base, the conductive column is at least partially placed outside the second outer housing, and two ends of the second elastic member respectively abut against the conductive column and the conductive base.

18. The bark control component according to claim 17, wherein the second outer housing comprises a second front housing and a second bottom housing, the second front housing and the second bottom housing are connected and form a cavity, and the second circuit board and the second wireless module are both disposed inside the cavity;
the second bottom housing is formed by melt injection molding, and the conductive base is fixed during the melt injection molding process; a stopping member is provided on an outer side wall of the conductive base, and the stopping member is arranged corresponding to a position of the second bottom housing.

19. The bark control component according to claim 18, wherein the stopping member comprises a first position limiting block and a second position limiting block both positioned on the outer side wall of the conductive base, the first position limiting block and the second position limiting block are spaced apart, a reinforcing cylinder is provided on the second bottom housing, the reinforcing cylinder is provided with a through hole penetrating through the reinforcing cylinder, and two ends of the reinforcing cylinder are each provided with a receiving slot in communication with the through hole; the second bottom housing is integrally formed with the reinforcing cylinder by injection molding, the conductive base passes through the through hole, and the first position limiting block and the second position limiting block are respectively placed in two receiving slots.

20. The bark control component according to claim 16, wherein the second circuit board is provided with a contact elastic sheet at a position corresponding to the conductive base, and the contact elastic sheet abut against the conductive base.

* * * * *